(12) United States Patent
Ikeda et al.

(10) Patent No.: US 11,718,082 B2
(45) Date of Patent: *Aug. 8, 2023

(54) METHOD OF MANUFACTURING FINE PATTERN AND METHOD OF MANUFACTURING DISPLAY DEVICE USING THE SAME

(71) Applicant: Merck Patent GmbH, Darmstadt (DE)

(72) Inventors: Hirokazu Ikeda, Kakegawa (JP); Toshiaki Nonaka, Kakegawa (JP); Yoshisuke Toyama, Kakegawa (JP); Takahide Suzuki, Kakegawa (JP)

(73) Assignee: Merck Patent GmbH, Darmstadt (DE)

( * ) Notice: Subject to any disclaimer, the term of this patent is extended or adjusted under 35 U.S.C. 154(b) by 415 days.

This patent is subject to a terminal disclaimer.

(21) Appl. No.: 16/757,430

(22) PCT Filed: Oct. 17, 2018

(86) PCT No.: PCT/EP2018/078351
§ 371 (c)(1),
(2) Date: Apr. 20, 2020

(87) PCT Pub. No.: WO2019/076956
PCT Pub. Date: Apr. 25, 2019

(65) Prior Publication Data
US 2021/0187930 A1    Jun. 24, 2021

(30) Foreign Application Priority Data
Oct. 20, 2017   (JP) ................................ 2017-203836

(51) Int. Cl.
*B32B 38/00* (2006.01)
*B32B 5/14* (2006.01)
(Continued)

(52) U.S. Cl.
CPC .......... *B32B 38/0036* (2013.01); *B32B 5/145* (2013.01); *G03F 7/18* (2013.01);
(Continued)

(58) Field of Classification Search
CPC ........................................................ G03F 7/16
See application file for complete search history.

(56) References Cited

U.S. PATENT DOCUMENTS 6,319,853 B1 * 11/2001 Ishibashi ................... G03F 7/40
430/312
2002/0037476 A1   3/2002 Kamijima
(Continued)

FOREIGN PATENT DOCUMENTS

JP        06-250379 A     9/1994
JP        H11204399 A     7/1999
(Continued)

OTHER PUBLICATIONS

International Search Report for PCT/EP2018/078351 dated Jan. 25, 2019.
(Continued)

*Primary Examiner* — Chanceity N Robinson
(74) *Attorney, Agent, or Firm* — Faegre Drinker Biddle & Reath LLP

(57) ABSTRACT

A method of manufacturing a fine pattern using the following steps of:
(1) coating a resist composition containing a novolak resin having an alkali dissolution rate of 100 to 3,000 Å on a substrate to form a resist composition layer;
(2) subjecting said resist composition layer to exposure;
(3) developing said resist composition layer to form a resist pattern;
(4) subjecting said resist pattern to flood exposure;
(5) coating a fine pattern forming composition on the surface of said resist pattern to form a fine pattern forming composition layer;

(Continued)

(6) heating said resist pattern and said fine pattern forming composition layer to cure the regions of said fine pattern forming composition layer in the vicinity of said resist pattern and to form an insolubilized layer; and
(7) removing uncured regions of said fine pattern forming composition layer.

13 Claims, 5 Drawing Sheets

(51) Int. Cl.
    *G03F 7/18*     (2006.01)
    *G03F 7/24*     (2006.01)
    *G03F 7/40*     (2006.01)
(52) U.S. Cl.
    CPC ............... *G03F 7/24* (2013.01); *G03F 7/405* (2013.01); *B32B 2457/202* (2013.01)

(56) References Cited

U.S. PATENT DOCUMENTS

| | | | |
|---|---|---|---|
| 2004/0096780 A1 | 5/2004 | Nozaki et al. | |
| 2010/0009482 A1* | 1/2010 | Park | H01L 21/32139 |
| | | | 430/311 |
| 2013/0069246 A1* | 3/2013 | Bae | G03F 7/40 |
| | | | 257/774 |
| 2015/0227042 A1* | 8/2015 | Kubota | G03F 7/40 |
| | | | 430/315 |
| 2018/0029251 A1 | 2/2018 | Kajiya | |

FOREIGN PATENT DOCUMENTS

| | | |
|---|---|---|
| JP | 3071401 B2 | 7/2000 |
| JP | 2001-093816 A | 4/2001 |
| JP | 2001-109165 A | 4/2001 |
| JP | 2001-242636 A | 9/2001 |
| JP | 2001-312060 A | 11/2001 |
| JP | 2003195496 A | 7/2003 |
| JP | 2004-061668 A | 2/2004 |
| JP | 2007-108483 A | 4/2007 |
| JP | 2016-190417 A | 11/2016 |
| WO | 01/22170 A1 | 3/2001 |
| WO | 01/25854 A1 | 4/2001 |

OTHER PUBLICATIONS

International Search Report for PCT/EP2018/078356 dated Jan. 30, 2019.
Written Opinion of the International Searching Authority for PCT/EP2018/078351 dated Jan. 25, 2019.
Written Opinion of the International Searching Authority for PCT/EP2018/078356 dated Jan. 30, 2019.
U.S. Appl. No. 16/757,435, filed Apr. 20, 2020, Ikeda et al.

* cited by examiner

| Example | Resist pattern | Fine pattern |
|---|---|---|
| 1 | 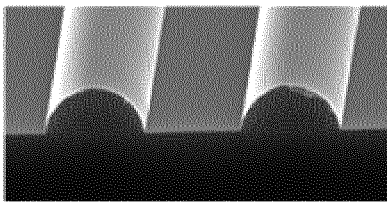<br>Line 3.06μm、Space 2.94μm | 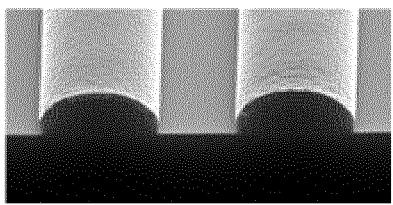<br>Line 3.58μm、Space 2.42μm |
| 2 | 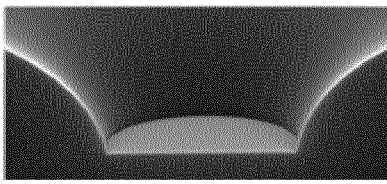<br>Hole 3.08μm | 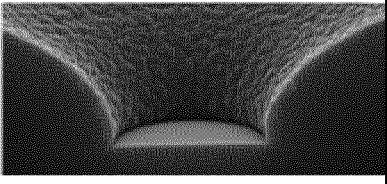<br>Hole 2.57μm |
| 3 | 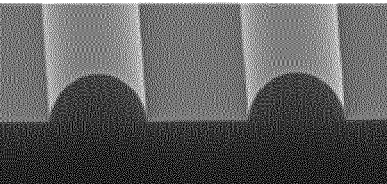<br>Line 2.98μm、Space 3.02μm | 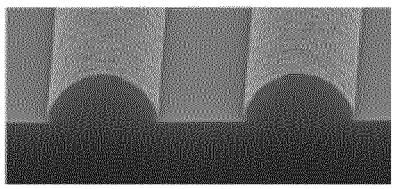<br>Line 3.28μm、Space 2.72μm |
| 4 | 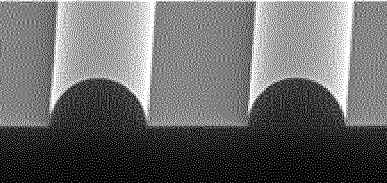<br>Line 2.97μm、Space 3.03μm | 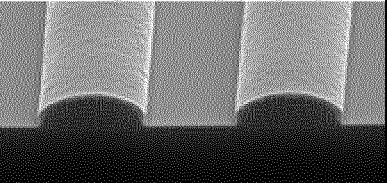<br>Line 3.41μm、Space 2.59μm |
| 5 | 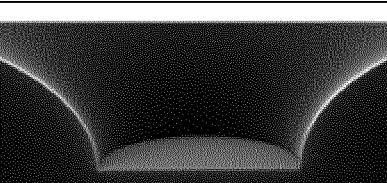<br>Hole 3.07μm | 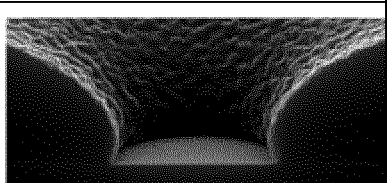<br>Hole 2.63μm |
FIG. 4-1

| Example | Resist pattern | Fine pattern |
|---|---|---|
| 6 | Line 3.17μm, Space 2.83μm | Line 3.54μm, Space 2.46μm |
| 7 | Line 3.17μm, Space 2.83μm | Line 3.68μm, Space 2.32μm |
| 8 | Line 3.17μm, Space 2.83μm | Line 3.73μm, Space 2.27μm |
| 9 | Line 3.04μm, Space 2.96μm | Line 3.62μm, Space 2.38μm |
| 10 | Line 3.04μm, Space 2.96μm | Line 3.81μm, Space 2.19μm |
| 11 | Line 3.04μm, Space 2.96μm | Line 3.95μm, Space 2.05μm |

FIG. 4-2

METHOD OF MANUFACTURING FINE PATTERN AND METHOD OF MANUFACTURING DISPLAY DEVICE USING THE SAME

CROSS-REFERENCE TO RELATED APPLICATIONS

This application is a national stage application (under 35 U.S.C. § 371) of PCT/EP2018/078351, filed Oct. 17, 2018, which claims benefit of Japanese Application No. 2017-203836, filed Oct. 20, 2017, both of which are incorporated herein by reference in their entirety.

BACKGROUND OF THE INVENTION

Technical Field

The present invention relates to a method of manufacturing a fine pattern capable of forming a finer pattern by reducing a separation size or a pattern aperture size already formed between resist patterns upon forming the resist patterns, and to a method of manufacturing a display device using the same.

Background Art

In recent years, in the manufacture of semiconductor devices and liquid crystal display devices, pattern formation using a resist has been performed. The resist process of the liquid crystal display device is applied to, for example, from the first generation of 300 mm×400 mm to a large-sized substrate of 2850 mm×3050 mm, which is called the $10^{th}$ generation, and is required to have high sensitivity in order to achieve high throughput. When applied to an extra-large glass substrate in this manner, the required characteristics are completely different from those for the case of a resist for manufacturing a semiconductor device including a manufacturing apparatus. For example, uniformity of the resist pattern size is required with respect to the entire surface of the large substrate. Further, unlike the case of a resist for manufacturing a semiconductor device, the light source to be used is a radiation having a wavelength of 300 nm or more, such as 365 nm (i-line), 405 nm (h-line) and 436 nm (g-line), and, in particular a wavelength mixture of these is used. Further the shape of the resist pattern is preferably a rectangle in the semiconductor manufacturing field, but an inclined (hereinafter referred to as "taper") shape on the inner side surface of a hole portion or the like is sometimes preferred since it is advantageous in the subsequent processing.

Recently, technological development for high-performance LCD called system LCD has been actively carried out, and further resolution enhancement of resist pattern is required. In general, in accordance with Rayleigh's equation:

Minimum resolution $R = k1 \times \lambda / NA$

Depth of focus $DOF = k2 \times \lambda / NA^2$ (in which k1 and k2 are constants, A is an exposure wavelength, and NA is a numerical aperture), it is necessary to use a light source of short wavelength or to use an exposure process of high NA (numerical aperture) in order to increase the resolution (resolution limit) of the resist pattern. However, in the liquid crystal display device manufacturing field, it was difficult to shorten the exposure wavelength than before by changing the light source device, and it was also difficult to achieve high NA from the viewpoint of throughput improvement (for example, Patent Document 1).

Further, in the semiconductor device manufacturing field, there is a technique for forming a fine pattern, such as phase shift mask and optical proximity correction (OPC), but since the NA is low and a wavelength mixture of g-, h-, i-line and the like is used in the actual manufacture of the liquid crystal display device, good effects cannot be expected by these techniques. In this way, even if the pattern miniaturization technique in the semiconductor device manufacturing field is diverted to the manufacture of display device, it does not necessarily succeed.

In addition, although it is in the semiconductor device manufacturing field, as a method of miniaturizing a resist pattern, a method of manufacturing a fine resist pattern having effectively below the resolution limit, which comprises forming a resist pattern using a resist composition, thereafter applying a coating layer on the resist pattern, and then heating or the like, to form a mixing layer between the coating layer and the resist pattern, and then removing a part of the coating layer to thicken the resist pattern and, as a result, reducing the separation size of the resist pattern or the hole aperture size to achieve miniaturization of the resist pattern, has been proposed (for example, Patent Documents 2 and 3).

PRIOR ART DOCUMENTS

Patent Documents

[Patent document 1] JP 2003-195496 A
[Patent document 2] JP 3071401 B
[Patent document 3] JP H11(1999)-204399 A

DISCLOSURE OF THE INVENTION

Problems to be Solved by the Invention

Under the technical background as described above, the inventors of the present invention conducted intensive studies to find a method of manufacturing a fine pattern that is practical in the manufacture of display devices. The inventors of the present invention considered that shortening the wavelength of the exposure wavelength is not practical since it needs to introduce an expensive apparatus and, in addition, the resist pattern shape approaches not a taper shape but a rectangle due to reduction of the optical interference. Further, since the process margin is wide when the DOF value is large, the present inventors considered it is advantageous to keep the DOF large. Because glass substrates generally used in the liquid crystal display devices have unevenness of about several tens of micrometers on the surface, so if the DOF is small, the accuracy of the pattern is liable to be affected by the unevenness, and the yield also gets worse. Here, the present inventors considered that it is not practical to enhance the resolution by raising NA (lowering the R in the above Rayleigh's equation) since DOF decreases in inverse proportion to the square of NA in accordance with the above Rayleigh's equation, from this point as well. Then, the inventors of the present invention conceived to obtain a finer pattern not by changing the exposure apparatus (exposure wavelength and lens) but by miniaturizing the developed resist pattern, in order to enhance the resolution (to lower the R in the Rayleigh's equation) in the manufacture of the display device and reached the present invention.

The present invention provides a method of manufacturing a resist pattern of effectively below the resolution limit, which is suitable for use in the liquid crystal display device manufacturing field. In particular the present invention provides a method of accurately manufacturing a fine pattern of below the resolution limit while maintaining a pattern shape having a taper shape. Furthermore, according to the present invention, a method of manufacturing a device, which comprises the method of manufacturing the fine pattern is provided.

Means for Solving the Problems

The method of manufacturing a fine pattern of the present invention comprises the following steps of:
(1) a step of coating a resist composition comprising a novolak resin having an alkali dissolution rate of 100 to 3,000 Å on a substrate to form a resist composition layer;
(2) a step of subjecting said resist composition layer to exposure;
(3) a step of developing said resist composition layer to form a resist pattern;
(4) a step of subjecting said resist pattern to flood exposure;
(5) a step of coating a fine pattern forming composition on the surface of said resist pattern to form a fine pattern forming composition layer;
(6) a step of heating said resist pattern and said fine pattern forming composition layer to cure the regions of said fine pattern forming composition layer in the vicinity of said resist pattern and to form an insolubilized layer; and
(7) a step of removing uncured regions of said fine pattern forming composition layer.

In addition, the method of manufacturing a display device according to the present invention comprises the above method.

Effects of the Invention

According to the present invention, a pattern having a high size reduction rate of the space portion or the hole portion and of below the resolution limit is formed well and economically while maintaining the shape having a taper shape.

Further, it is possible to manufacture a finer pattern with a low exposure dose.

Using the fine resist pattern thus formed as a mask, it is possible to form a reduced pattern on a substrate, and to manufacture a device or the like having a fine pattern easily and with high yield.

BRIEF DESCRIPTION OF THE DRAWINGS

FIG. 4-1: Resist patterns and fine patterns of Examples 1 to 5
FIG. 4-2: Resist patterns and fine patterns of Examples 6 to 11

DETAILED DESCRIPTION OF THE INVENTION

Mode for Carrying Out the Invention

Figure 1:
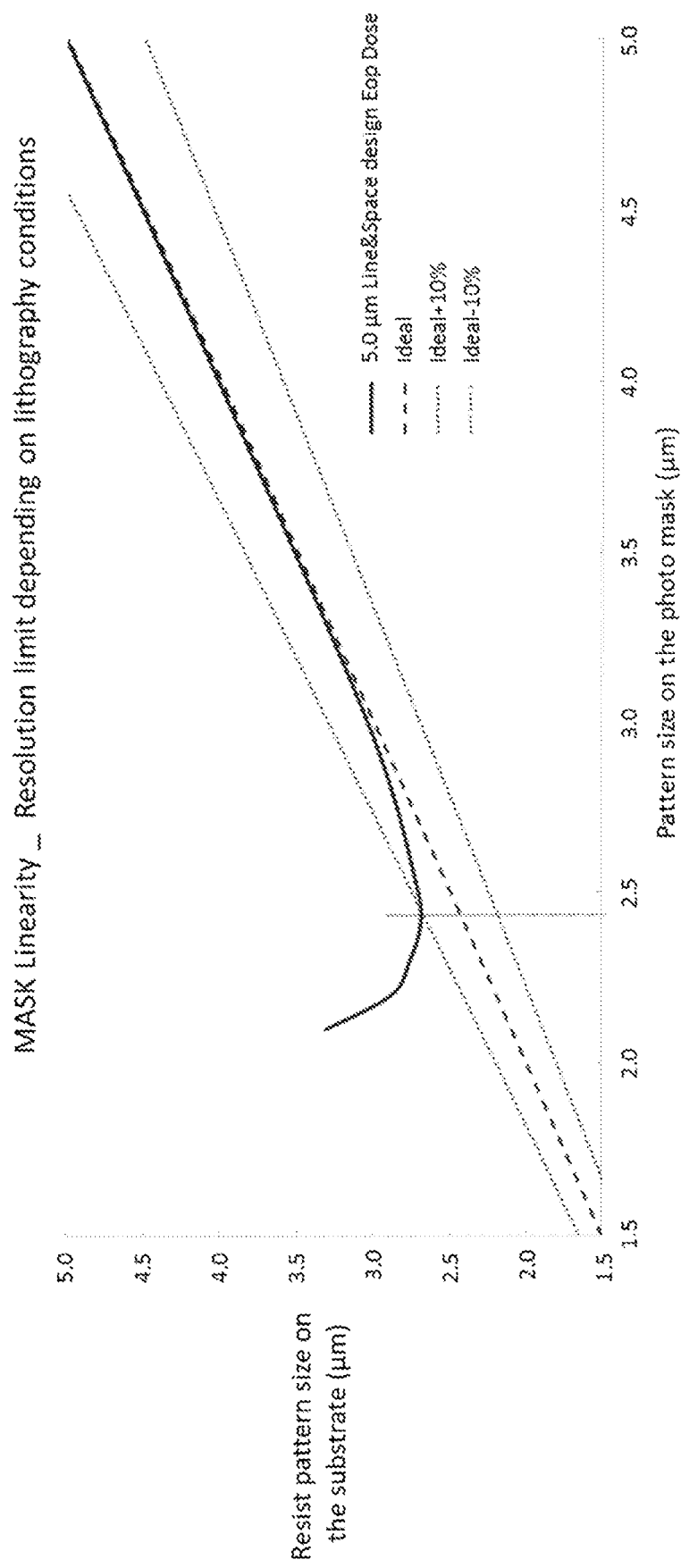
FIG. 1: Explanatory drawing of resolution limit

Embodiments of the present invention are described in detail below. Hereinafter, symbols, units, abbreviations, and terms have the following meanings in the present specification unless otherwise specified.

In the present specification, when numerical ranges are indicated using "-" or "to", they include both end points and units thereof are common. For example, 5-25 mol % means 5 mol % or more and 25 mol % or less.

In the present specification, when a polymer has a plural type of repeating units (constituent units), these repeating units are copolymerized. These copolymerization may be any of alternating copolymerization, random copolymerization, block copolymerization, graft copolymerization, or a mixture thereof.

In the present specification, "%" represents mass %, "part(s)" represents part(s) by mass, and "ratio" represents ratio by mass.

In the present specification, Celsius is used as the temperature unit. For example, 20 degrees means 20 degrees Celsius.

[Fine Pattern Forming Method]

The method of manufacturing a fine pattern of the present invention comprises the following steps of:
(1) a step of coating a resist composition comprising a novolak resin having an alkali dissolution rate of 100 to 3,000 Å on a substrate to form a resist composition layer;
(2) a step of subjecting said resist composition layer to exposure;
(3) a step of developing said resist composition layer to form a resist pattern;
(4) a step of subjecting said resist pattern to flood exposure;
(5) a step of coating a fine pattern forming composition on the surface of said resist pattern to form a fine pattern forming composition layer;
(6) a step of heating said resist pattern and said fine pattern forming composition layer to cure the regions of said fine pattern forming composition layer in the vicinity of said resist pattern and to form an insolubilized layer; and
(7) a step of removing uncured regions of said fine pattern forming composition layer.

Hereinafter, an example of a method of manufacturing a fine pattern according to the present invention is described for each step referring to the drawings.

<Step (1)>

Step (1) is a step of coating a resist composition comprising a novolac resin having an alkali dissolution rate of 100-3000 Å on a substrate to form a resist composition layer.

The substrate to be used is not particularly limited, and examples thereof include a glass substrate, a plastic substrate. Preferably, it is a large glass square substrate of 500×600 mm² or more. The substrate may be one on which surface a silicon oxide film, a metal film such as aluminum, molybdenum and chromium, a metal oxide film such as ITO, further a semiconductor device, a circuit pattern, or the like is provided as required. Here, said semiconductor device is preferably used for controlling the display device of the present invention.

The resist composition is coated on a substrate by a method such as slit coating and spin coating. In addition, the coating method is not limited to the method specifically described above, and any coating method conventionally used for coating a photosensitive composition may be used. After coating the resist composition onto the substrate, if necessary, the substrate is heated from 70° C.-110° C., and the solvent component is volatilized to form a resist composition layer. This heating may be sometimes referred to as "pre-baking" or "first heating". The heating (this is similar in heating in the subsequent steps) can be performed using a hot plate, an oven, a furnace, or the like. The resist composition layer to which the composition according to the present invention is applied preferably has a film thickness after pre-baking of 1.0-3.0 µm, more preferably 1.3-2.5 µm.

[Resist Composition]

The resist composition is not particularly limited as long as the alkali dissolution rate of the novolac resin is 100-3,000 Å, and a resist composition used in the liquid crystal display device manufacturing field is preferably used.

The novolac resin contained in the resist composition may be any known novolac resin used in a photosensitive composition comprising an alkali-soluble resin and a photosensitizer containing a quinone diazide group, and is not particularly limited. The novolak resin that can be preferably used in the present invention is obtained by subjecting various phenols alone or a mixture of a plurality of these phenols to polycondensation with aldehydes such as formalin.

Examples of the phenol constituting the novolak resin include phenol, p-cresol, m-cresol, o-cresol, 2,3-dimethylphenol, 2,4-dimethylphenol, 2,5-dimethylphenol, 2,6-dimethylphenol, 3,4-dimethylphenol, 3,5-dimethylphenol, 2,3,4-trimethylphenol, 2,3,5-trimethylphenol, 3,4,5-trimethylphenol, 2,4,5-trimethylphenol, methylenebisphenol, methylenebis-p-cresol, resorcin, catechol, 2-methylresorcin, 4-methylresorcin, o-chlorophenol, m-chlorophenol, p-chlorophenol, 2,3-dichlorophenol, m-methoxyphenol, p-methoxyphenol, p-butoxyphenol, o-ethylphenol, m-ethylphenol, p-ethylphenol, 2,3-diethylphenol, 2,5-diethylphenol, p-isopropylphenol, α-naphthol, β-naphthol and the like. These can be used alone or in combination of two or more.

Further, examples of aldehydes include, besides formalin, paraformaldehyde, acetaldehyde, benzaldehyde, hydroxybenzaldehyde, chloroacetaldehyde and the like, which can be used alone or in combination of two or more.

The alkali dissolution rate of the novolak resin to be used in the present invention is 100-3,000 Å, preferably 400-1,000 Å. Here, in the present invention, the alkali dissolution rate is measured from the dissolution time of the resin film with respect to an aqueous solution of 2.38% (+−1% concentration accepted) tetramethylammonium hydroxide (hereinafter referred to as TMAH). The mass average molecular weight of the novolak resin is preferably 1,500-25,000, more preferably 3,000-12,000 in terms of polystyrene.

In addition, the alkali dissolution rate of the novolac resin of the resist composition used in the semiconductor manufacturing field is usually 100 Å or more and less than 400 Å.

The resist composition of the present invention comprises a photosensitizer. The photosensitizer is a photosensitizer preferably having a quinone diazide group and is preferably one prepared by reacting quinone diazide sulfonic acid halides such as naphthoquinone diazide sulfonic acid chloride and benzoquinone diazide sulfonic acid chloride with a low molecular weight compound or polymer compound having a functional group capable of condensation reaction with this acid halide. Here, the functional group capable of condensing with the acid halide includes a hydroxyl group, an amino group and the like, and a hydroxyl group is particularly preferable. Examples of the low molecular compound having a hydroxyl group include hydroquinone, resorcin, 2,4-dihydroxybenzophenone, 2,3,4-trihydroxybenzophenone, 2,4,6-trihydroxybenzophenone, 2,4,4'-trihydroxybenzophenone, 2,3,4,4'-tetrahydroxybenzophenone, 2,2',4,4'-tetrahydroxybenzophenone, 2,2',3,4,6'-pentahydroxybenzophenone and the like, and examples of the polymer compound having a hydroxyl group include novolac resin, polyvinyl phenol and the like. Further, the reactant of the quinonediazide sulfonic acid halide and the compound having a hydroxyl group may be a single esterified product or a mixture of two or more different compounds having different esterification ratios. In the present invention, these photosensitizers having a quinone diazide group are usually used in an amount of 1-30 parts by mass, preferably 15-25 parts by mass, based on 100 parts by mass of the resin component in the photosensitive composition.

The resist composition of the present invention comprises a solvent. Examples of the solvent include ethylene glycol monoalkyl ethers such as ethylene glycol monomethyl ether and ethylene glycol monoethyl ether; ethylene glycol monoalkyl ether acetates such as ethylene glycol monomethyl ether acetate and ethylene glycol monoethyl ether acetate; propylene glycol monoalkyl ethers such as propylene glycol monomethyl ether and propylene glycol monoethyl ether; propylene glycol monoalkyl ether acetates such as propylene glycol monomethyl ether acetate and propylene glycol monoethyl ether acetate; lactates such as methyl lactate and ethyl lactate; aromatic hydrocarbons such as toluene and xylene; ketones such as methyl ethyl ketone, 2-heptanone and cyclohexanone; amides such as N, N-dimethylacetamide and N-methylpyrrolidone; lactones such as γ-butyrolactone. These solvents can be used alone or in combination of two or more.

The compounding ratio of the solvent varies depending on the coating method and the requirement for the film thickness after coating. For example, in the case of spray coating, it becomes 90% or more based on the total mass of the novolak resin, the photosensitizer and optional components, but in the case of slit coating of a large glass substrate used for manufacturing displays, it is 50% or more (preferably 60% or more), and/or 90% or less, and (preferably 85% or less).

Examples of other components that may be comprised in the resist composition used in the present invention include surfactant, adhesion enhancer, and the like <Step (2)>

Step (2) is a step of subjecting the resist composition layer to exposure. The resist composition layer is exposed for patterning through a desired mask. The exposure wavelength used at this time may be any one of a single wavelength such as g-line (436 nm), h-line (405 nm), and i-line (365 nm), which are conventionally used for exposing the photosensitive composition, wavelength mixture of g-line and h-line, and one in which i-line, h-line and g-line are mixed, which is called broadband, and the like, but it preferably comprises at least wavelength of 300-450 nm, more preferably 350-450 nm. The exposure amount is preferably 15-80 mJ/cm$^2$, more preferably 20-60 mJ/cm$^2$.

In the present invention, an exposure apparatus having a resolution limit of 1.5-5.0 µm, more preferably 1.5-4.0 µm, is suitable. Here, the resolution limit in the present invention is defined as follows.

(1) First, a resist film is prepared. In the case of a coating method in which a resist solution is dropped onto a substrate from a resist discharge nozzle and then the substrate is spun to obtain a coating film, AZ SFP-1500 (10 cP) (manufactured by Merck Performance Materials Ltd., hereinafter referred to as Merck) is used as the resist composition. In the case of a coating method in which a coating film is obtained by relatively moving a resist discharge nozzle and a substrate, AZ SR-210-J (manufactured by Merck) is used as the resist composition. The resist composition is coated on a glass substrate so that the film thickness after pre-baking becomes 1.5 µm, and pre-baked at 110° C. for 160 seconds on a hot plate. The obtained film is taken as a resist film.

(2) The obtained resist film is exposed using a mask having a pattern of 1:1 line & space of 5.0 μm and then developed with 2.38% TMAH aqueous solution at 23° C. for 60 seconds to obtain a resist pattern.

(3) When the exposure amount is changed, the measured size of the obtained resist pattern changes. Therefore, a calibration curve representing the relationship between the exposure amount and the measured size of the resist pattern is created. In particular the size of the mask is fixed at the above size, a plurality of resist patterns is formed by changing the exposure amount, and a calibration curve is prepared based on these data. From this calibration curve, the exposure amount Eop where the measured size of the resist pattern coincides with the mask size (a pattern of 1:1 line & space of 5.0 μm) is determined.

(4) When the exposure amount is made constant, as the size of the mask is changed, the measured size of the resist pattern also changes. Therefore, a graph representing the relationship with the measured size of the resist pattern is created. In particular a plurality of resist patterns of different sizes is formed by fixing the exposure amount at an Eop and reducing the pattern size of the mask, and the measured sizes of the resist patterns with respect to the pattern sizes of the mask are plotted. Here, the pattern size of the mask and the measured value of the formed resist pattern are likely to be theoretically proportional relationship, but actually, when the mask size becomes very small, a gap from the proportional relationship occurs. The size of the mask causing such a gap is taken as the resolution limit. In particular the size of the mask when the measured size of the resist pattern exceeds the range of ±10% with respect to the size of the mask is taken as the resolution limit. For example, FIG. 1 is a graph when the size of the mask is changed while keeping the exposure amount constant, and the resolution limit obtained from this graph is about 2.4 μm.

The exposure is preferably performed using a projector lens having a numerical aperture NA of 0.08-0.15, preferably 0.083-0.145, more preferably 0.083-0.10. In the case of not using a lens for exposure (so-called mirror projection system), strictly speaking, NA does not exist, but interpretation is made by replacing with the numerical aperture NA of the case that the above-mentioned resolution limit is about the same.

<Step (3)>

Step (3) is a step of developing the resist composition layer to form a resist pattern. After the exposure, by developing with an alkali developing solution, the exposed regions are dissolved and only the unexposed regions are left to form a positive pattern. As the alkali developing solution, an aqueous solution of a quaternary amine such as TMAH and an aqueous solution of an inorganic hydroxide such as sodium hydroxide and potassium hydroxide are generally used. Here, the exposed regions are dissolved into the developing solution, the unexposed regions are left on the substrate, and a resist pattern is formed.

Optionally, step (3-1), which is a step of heating the resist pattern, can be comprised after step (3). This heating may be sometimes referred to as "post-baking" or "second heating". The purpose of this post-baking is to improve etching resistance. The temperature of post-baking is preferably 110-150° C., more preferably 130-140° C. The post-baking time is, in the case of a hot plate, preferably 30-300 seconds, more preferably 60-180 seconds.

Figure 2:
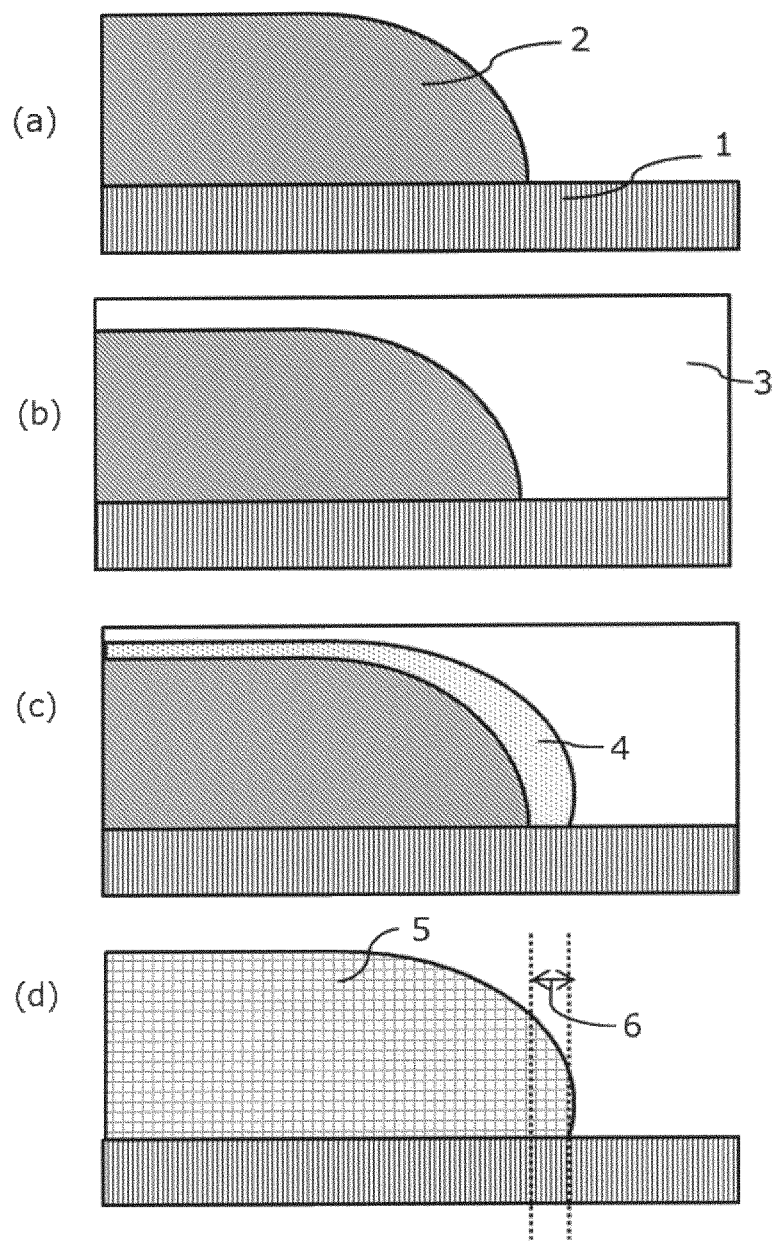
FIG. 2: Explanatory drawing of a method of manufacturing a fine pattern
Figure 3:
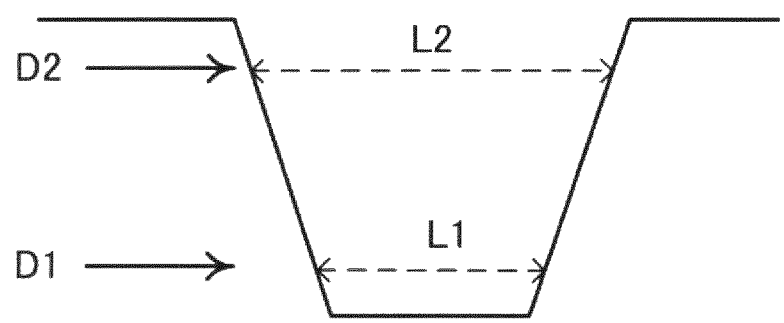
FIG. 3: Explanatory drawing of a taper shape

FIG. 2 (a) shows a state in which a resist pattern 2 is formed on the substrate 1. The cross section shape of the formed resist pattern is preferably a taper shape. In the present specification, as shown in FIG. 3, the taper shape means that the ratio L2/L1 is 1.05 or more when a cross section shape of a hole or a line is observed, wherein L1 is the pattern width at a 10% portion (D1) of the depth and L2 is the pattern width at a 90% portion (D2) of the depth. L2/L1 may be hereinafter referred to as taper index.

In the present invention, in the case that the resist pattern has a taper shape, a gentle shape is transferred when wiring processing is thereafter performed by dry etching or the like. On the contrary, when the resist pattern is rectangular, wire disconnection easily occurs at the time of laminating thin films due to etching failure. In the resist pattern having a taper shape in the present invention, when a tangent is drawn on the same pattern at the depth of D2 and the substrate is horizontal, the angle thereof is preferably less than 90 degrees, more preferably 30-80 degrees, further preferably 35-75 degrees, and even more preferably 40-70 degrees.

The taper index of the resist pattern is preferably 1.05-18, more preferably 1.05-10.

<Step (4)>

Step (4) is a step of subjecting the resist pattern to flood exposure. Flood exposure is performed with an exposure wavelength of 350-450 nm via no mask or using a blank mask (all light is transmitted). By performing flood exposure, the regions which were the unexposed regions at the time of the first patterning exposure is exposed, so that an acid is generated from the photosensitizer. It is assumed that this acid functions as a catalyst to promote cross-linking when an insolubilized layer is formed.

<Step (5)>

Step (5) is a step of coating a fine pattern forming composition on the surface of the resist pattern to form a fine pattern forming composition layer. Coating of the fine pattern forming composition may be carried out by any known method, but it is preferably carried out by the same method as in the coating of the resist composition. Here, the film thickness of the fine pattern forming composition may be of any amount, but it is preferably about 3.0-6.0 μm when it is coated on, for example, bare silicon. After coating, pre-baking is carried out as needed (for example, at 60-90° C. and for 15-90 seconds) to form a fine pattern forming composition layer. FIG. 2 (b) shows a state in which a fine pattern forming composition is coated on the formed resist pattern to form a fine pattern forming composition layer 3.

[Fine Pattern Forming Composition]

The fine pattern forming composition according to the present invention is not particularly limited, but preferably comprises a cross-linking agent, a polymer, and a solvent. The viscosity of the fine pattern forming composition according to the present invention is preferably 1-120 cP, more preferably 10-80 cP. Here, the viscosity is measured by a capillary viscometer at 25° C.

As the cross-linking agent, a melamine type cross-linking agent, a urea type cross-linking agent, an amino type cross-linking agent and the like are effectively used, but there is no particular limitation as long as it is a water-soluble cross-linking agent which causes cross-linking by an acid. Suitable examples thereof include methoxymethylol melamine, methoxyethylene urea, glycoluril, isocyanate, benzoguanamine, ethylene urea, ethylene urea carboxylic acid, (N-methoxymethyl)dimethoxyethylene urea, (N-methoxymethyl) methoxyhydroxyethylene urea, N-methoxymethyl urea, or a combination of two or more cross-linking agents selected from these groups. Preferably, it is methoxymethylol melamine, methoxyethylene urea, (N-methoxymethyl)dimethoxyethylene urea, (N-methoxymethyl)methoxyhydroxyethylene urea, N-methoxymethyl urea, or a combination of two or more cross-linking agents selected from these groups.

As the polymer, polyvinyl acetal resin, polyvinyl alcohol resin, polyacrylic acid resin, water-soluble resin containing oxazoline, aqueous urethane resin, polyallylamine resin, polyethyleneimine resin, polyvinylamine resin, water-soluble phenol resin, water-soluble epoxy resin, polyethyleneimine resin, styrene-maleic acid copolymer, and the like are effectively used, but there is no particular limitation as long as it causes a cross-linking reaction in the presence of an acidic component. Suitable examples include polyvinyl acetal resin, polyallylamine resin, and water-soluble resin containing polyvinyl alcohol oxazoline.

The solvent is for dissolving said cross-linking agent, polymer and other additives to be optionally used. It is necessary that such a solvent does not dissolve the resist pattern. Preferable examples thereof include water or a solvent containing water. It is also possible to use water in combination with water-soluble organic solvent. Such a water-soluble organic solvent is not particularly limited as long as it is a solvent which is soluble in water by 0.1% or more and, for example, isopropyl alcohol (IPA) and the like are included. These solvents can be used alone or in combination of two or more.

Examples of other additives that may be included in the fine pattern forming composition include, for example, surfactant, acid or base, plasticizer, leveling agent and the like.

The surfactant is useful for improving coatability and solubility.

The content ratio of the surfactant is preferably 0.01-5 mass % and more preferably 0.05-3 mass %, based on the total mass of the fine pattern forming composition.

The acid or base is used to adjust the pH of treating liquid or to improve the solubility of adding component. The acid or base to be used can be optionally selected as long as the effect of the present invention is not impaired, and examples thereof include carboxylic acids, amines and ammonium compounds. These include fatty acids, aromatic carboxylic acids, primary amines, secondary amines, tertiary amines, and ammonium compounds, and these may be substituted by any substituent or not substituted.

The content ratio of the acid is preferably 0.005-0.1 mass % based on the total mass of the fine pattern forming composition. The content ratio of the base is preferably 0.01-0.3 mass % based on the total mass of the fine pattern forming composition.

<Step (6)>

Step (6) is a step of heating the resist pattern and the fine pattern forming composition layer to cure the regions of the fine pattern forming composition layer in the vicinity of the resist pattern and to form an insolubilized layer 4. The heating in this step may be sometimes referred to as "mixing baking" or "third heating". FIG. 2 (c) shows a state in which an insolubilized layer is formed after mixing baking the formed fine pattern forming composition layer and the resist pattern. By the mixing baking, for example, the polymer in the resist composition and the polymer in the fine pattern forming composition layer are cross-linked by a cross-linking agent, the regions in the vicinity of the resist pattern are cured, and an insolubilized layer is formed. The temperature and the baking time of the mixing baking are appropriately determined depending on the resist to be used, the material used in the fine pattern forming composition, the line width of the target fine pattern, and the like. The temperature of the mixing baking is preferably 50-140° C., more preferably 80-120° C. The baking time is, in the case of a hot plate, preferably 90-300 seconds, more preferably 150-240 seconds.

<Step (7)>

Step (7) is a step of removing the uncured regions of the fine pattern forming composition layer. FIG. 2 (d) shows a state in which the uncured regions of the fine pattern forming composition layer are removed to form the fine pattern 5. The method of removing the uncured regions is not particularly limited, but it is preferable to remove them by contacting the fine pattern forming composition layer and water, a liquid mixture of water and a water-soluble organic solvent, or an alkali aqueous solution. An aqueous solution containing isopropyl alcohol and an aqueous solution containing TMAH are more preferable as the contacting liquid. In addition, depending on the removal conditions, the thickness of the insolubilized layer may change. For example, by prolonging the contact time with the liquid, the thickness of the insolubilized layer may become thin. Through the above processing, the space portion of the pattern is effectively miniaturized, and a fine pattern 5 can be obtained.

Here, as shown in FIG. 2 (d), the distance between the bottom position of the resist pattern and the bottom position of the fine pattern is defined as a shrink amount 6. The shrink amount is preferably 0.05-1.00 μm, more preferably 0.10-0.50 μm. The shrink amount can be measured, for example, by measuring the space width or the hole diameter at the bottom of the resist pattern with respect to four points by cross-section observation to obtain the average space width or hole diameter ($S^1$), and similarly measuring the average space width or the hole diameter ($S^2$) after formation of the fine pattern. The value obtained by dividing $S^2-S^1$ by 2 can be calculated as the shrink amount.

The cross section shape of the fine pattern is preferably a taper shape. The taper index is preferably 1.05-18, more preferably 1.05-10, further preferably 1.2-8, and even more preferably 1.5-8.

After the fine pattern is formed, it can be heated optionally. In the present invention, this heat treatment may be sometimes referred to as "second post-baking" or "fourth heating". By the second post-baking, the space portion of the fine pattern can be further miniaturized to obtain a high-defined pattern. In this step, it is considered that heat flow occurs in the fine pattern to induce deform of the pattern. The temperature of the second post-baking is preferably 100-145° C., more preferably 100-120° C. The baking time is preferably 90-300 seconds, more preferably 150-240 seconds when hot plate is used.

The cross section shape of the high-defined pattern is preferably a taper shape. The taper index of the high-defined pattern can be made larger by post-baking. Therefore, it is possible to adjust the shape of the pattern to more preferable one. In particular the taper index of the high-defined pattern is preferably 1.05-18, more preferably 1.05-10, further preferably 1.2-9, even more preferably 1.3-8, and still more preferably 1.8-8.

<Method of Manufacturing Display Device>

The formed fine pattern can be used for processing the substrate. In particular various substrates to be a base can be processed using the fine pattern as a mask, by means of dry etching method, wet etching method, ion implantation method, metal plating method, or the like. For example, a substrate may be etched by dry etching or wet etching to form a recess, which may be filled with a conductive material to form a circuit structure, or a metal layer may be formed by means of metal plating method in the regions uncovered by the fine pattern to form a circuit structure.

Using the fine pattern as a mask, after processing as desired, the fine pattern is removed. Thereafter, if necessary, the substrate is further processed, and a display device is formed. For these further processing, any known method can be applied.

In the present invention, the display device means a device which displays an image (including characters) on the display surface. The display device is preferably flat panel display (FPD). The FPD is preferably liquid crystal display, plasma display, organic EL (OLED) display, field emission display (FED), more preferably liquid crystal display.

Hereinafter, the present invention is described by use of Examples. These Examples are for explanation and not to intend limiting the scope of the present invention.

Example 1

AZ SFP-1500 (10 cP) (manufactured by Merck) that is a resist composition was coated on a 4-inch silicon wafer using a spin coater (Dual-1000, manufactured by Litho Tech Japan Corporation) to form a resist composition layer. In addition, the alkali dissolution rate of the novolak resin in AZ SFP-1500 (10 cP) is about 500 Å.

The resist composition layer was pre-baked on a hot plate at 110° C. for 160 seconds. The film thickness of the resist composition layer after pre-baked was 1.5 µm. Thereafter, a mask was set so that it becomes Line=3.0 µm and Space=3.0 µm in theory, and the resist composition layer was exposed with mixed wavelengths of g-line and h-line at 23.0 mJ/cm$^2$ using a stepper (FX-604 (NA=0.1), manufactured by Nikon Corporation). It was developed with 2.38% TMAH developer at 23° C. for 60 seconds to form a resist pattern. The obtained resist pattern was post-baked at 135° C. for 180 seconds on a hot plate. The resist pattern after post-baked was subjected to flood exposure using an exposure apparatus (PLA-501F, manufactured by Canon Inc.). The wavelength of this time was mixture ones of g-line, h-line and i-line. As a fine pattern forming composition, one in which a solid component of AZ R200 (manufactured by Merck) was made 1.48 times was prepared, and this was taken as AZ R200 (11%). AZ R200 (11%) was coated on the surface of the resist pattern using a spin coater (MS-A 100, manufactured by Mikasa Co., Ltd.) to form a fine pattern composition layer. The fine pattern forming composition layer was subjected to mixing baking at 100° C. for 180 seconds on a hot plate to form an insolubilized layer. The film thickness after mixing baking was 4.0 µm. Finally, the uncured regions were removed by developing with R2 Developer (manufactured by Merck), and a fine pattern was obtained.

Example 2

A resist pattern was formed in the same manner as in Example 1 except that the mask was set so that the hole diameter became 3.0 µm, the exposure amount was 46.0 mJ/cm$^2$, and the film thickness of the resist composition layer was 2.4 µm. Thereafter, in the same manner as in Example 1, a fine pattern was formed. The film thickness after mixing baking was 3.5 µm.

Example 3

As in Example 1, a resist pattern was formed. Thereafter, a fine pattern was formed in the same manner as in Example 1 except that as a fine pattern forming composition, the composition (22%) in which a solid component of AZ R602 (manufactured by Merck) was made 3.04 times was used and water was used for removing the uncured regions. The film thickness after mixing baking was 2.5 µm.

Example 4

As in Example 1, a resist pattern was formed. Thereafter, a fine pattern was formed in the same manner as in Example 1 except that the temperature of the mixing baking was set to 120° C. and 0.1% TMAH aqueous solution was used for removing the uncured regions. The film thickness after mixing baking was 3.5 µm.

Example 5

As in Example 2, a resist pattern was formed. Thereafter, a fine pattern was formed in the same manner as in Example 2 except that the temperature of the mixing baking was set to 120° C. The film thickness after mixing baking was 3.5 µm.

Example 6

A fine pattern was formed in the same manner as in Example 1 except that the film thickness after mixing baking was 3.5 µm.

Example 7

As in Example 1, a resist pattern was formed. Thereafter, a fine pattern was formed in the same manner as in Example 1 except that as a fine pattern forming composition, the composition in which 0.17 parts by mass of the surfactant MEGAFAC F-410 (manufactured by DIC Corporation) was added to 100 parts by mass of AZ R200 (11%) was used. The film thickness after mixing baking was 3.5 µm.

Example 8

As in Example 1, a resist pattern was formed. Thereafter, a fine pattern was formed in the same manner as in Example 1 except that as a fine pattern forming composition, the composition in which 0.17 parts by mass of the surfactant SURFLON S-241 (manufactured by AGC Seimi Chemical Co., Ltd.) was added to 100 parts by mass of AZ R200 (11%) was used. The film thickness after mixing baking was 3.5 µm.

Example 9

As in Example 1, a resist pattern was formed. Thereafter, a fine pattern was formed in the same manner as in Example 1 except that as a fine pattern forming composition, the composition in which the cross-linking agent of AZ R200 was made 2.09 times and other solid component was made 1.37 times was used and 0.1% TMAH aqueous solution was used for removing the uncured regions. The film thickness after mixing baking was 3.5 µm.

Example 10

As in Example 1, a resist pattern was formed. Thereafter, a fine pattern was formed in the same manner as in Example 9 except that as a fine pattern forming composition, the composition in which 0.08 parts by mass of 1,4-diazabicyclo [2,2,2]octane (manufactured by Tokyo Chemical Industry Co., Ltd.) was added to 100 parts by mass of the fine pattern forming composition used in example 9. The film thickness after mixing baking was 3.5 μm.

Example 11

As in Example 1, a resist pattern was formed. Thereafter, a fine pattern was formed in the same manner as in Example 9 except that as a fine pattern forming composition, the composition in which 0.08 parts by mass of pentaethylenehexamine (manufactured by Tokyo Chemical Industry Co., Ltd.) was added to 100 parts by mass of the fine pattern forming composition used in example 9. The film thickness after mixing baking was 3.5 μm.

The resist patterns and fine patterns in Examples 1-11 were as shown in FIG. 4-1 and FIG. 4-2, with respective values for decreased with and amount of shrink given in Table 1 below. The length measurement of the obtained pattern was conducted using SEM (JSM-7100F, manufactured by JEOL Ltd.), and the decreased width of the space or hole and the shrink amount were calculated.

TABLE 1

| Example | Decreased width of the space or hole | Shrink amount |
|---|---|---|
| 1 | 0.52 μm (decrease of 17.7% space) | 0.26 μm |
| 2 | 0.51 μm (decrease of 16.6% hole) | 0.255 μm |
| 3 | 0.30 μm (decrease of 9.9% space) | 0.15 μm |
| 4 | 0.44 μm (decrease of 14.5% space) | 0.22 μm |
| 5 | 0.44 μm (decrease of 14.3% hole) | 0.22 μm |
| 6 | 0.37 μm (decrease of 13.1% space) | 0.185 μm |
| 7 | 0.51 μm (decrease of 18.0% space) | 0.255 μm |
| 8 | 0.56 μm (decrease of 19.8% space) | 0.28 μm |
| 9 | 0.58 μm (decrease of 19.6% space) | 0.29 μm |
| 10 | 0.77 μm (decrease of 26.0% space) | 0.38 5μm |
| 11 | 0.91 μm (decrease of 30.7% space) | 0.455 μm |

Evaluation of Pattern Shape

The taper index (L2/L1) was calculated by observing cross sections of the obtained resist patterns and fine patterns, and the obtained results are shown in Table 2.

TABLE 2

| | Resist pattern | Fine pattern |
|---|---|---|
| Example 1 | 1.63 | 1.85 |
| Example 2 | 3.46 | 4.83 |
| Example 3 | 1.56 | 1.82 |
| Example 4 | 1.62 | 1.70 |
| Example 5 | 3.46 | 4.42 |
| Example 6 | 1.71 | 1.57 |
| Example 7 | 1.71 | 1.73 |
| Example 8 | 1.71 | 1.84 |
| Example 9 | 1.61 | 1.75 |
| Example 10 | 1.61 | 1.69 |
| Example 11 | 1.61 | 1.62 |

EXPLANATION OF SYMBOLS 1. substrate
2. resist pattern
3. fine pattern forming composition layer
4. insolubilized layer
5. fine pattern
6. shrink amount

The invention claimed is:

1. A method of manufacturing a fine pattern comprising the following steps of:
   (1) a step of coating a resist composition comprising a novolak resin having an alkali dissolution rate of 100 to 3,000 A on a substrate to form a resist composition layer;
   (2) a step of subjecting said resist composition layer to exposure;
   (3) a step of developing said resist composition layer to form a resist pattern;
   (4) a step of subjecting said resist pattern to flood exposure;
   (5) a step of coating a fine pattern forming composition on the surface of said resist pattern to form a fine pattern forming composition layer;
   (6) a step of heating said resist pattern and said fine pattern forming composition layer to cure the regions of said fine pattern forming composition layer in the vicinity of said resist pattern and to form an insolubilized layer; and
   (7) a step of removing uncured regions of said fine pattern forming composition layer and
   wherein the exposure in the step (2) is performed using a projector lens having a numerical aperture of 0.08-0.15 and
   wherein a resist pattern is formed and has a cross section shape of a hole or a line is observed, L1 is the pattern width at a 10 percent portion (D1) of the depth and L2 is the pattern width at a 90 percent portion (D2) of the depth and has a Taper index (L2/L1) of the fine pattern is 1.05-18.

2. The method according to claim 1, wherein the exposure in the step (2) is performed using an exposure apparatus having a resolution limit of 1.5-5.0 μm.

3. The method according to claim 1, wherein the exposure amount in the step (2) is 15-80 mJ/cm².

4. The method according to claim 1, wherein the exposure in step (2) is preformed by a light irradiated at a wavelength of 300-450 nm.

5. The method according to claim 1, wherein the mass average molecular weight of said novolak resin is 1,500-25,000.

6. The method according to claim 1, further comprising step (3-1) which is a step of heating said resist pattern.

7. The method according to claim 1, wherein said fine pattern forming composition comprises a cross-linking agent, a polymer, and a solvent.

8. The method according to claim 1, wherein the viscosity of said fine pattern forming composition measured by a capillary viscometer at 25° C. is 1-120 cP.

9. The method according to claim 1, wherein the shrink amount of said fine pattern is 0.05-1.00 μm.

10. The method according to claim 1, wherein the temperature of the heating in the step (6) is 50-140° C.

11. The method according to claim 1, wherein the uncured regions are removed by contacting said fine pattern forming composition layer and water, a liquid mixture of water and a water-soluble organic solvent, or an alkali aqueous solution in the step (7).

12. The method according to claim 1, wherein the cross section shape of said resist pattern is a taper shape.

13. A method of manufacturing a display device comprising using a fine pattern made by the method according to claim 1.

* * * * *